United States Patent
Liou et al.

(10) Patent No.: US 9,482,964 B2
(45) Date of Patent: Nov. 1, 2016

(54) OVERLAP MARK SET AND METHOD FOR SELECTING RECIPE OF MEASURING OVERLAP ERROR

(71) Applicant: United Microelectronics Corp., Hsinchu (TW)

(72) Inventors: En-Chiuan Liou, Tainan (TW); Chia-Chang Hsu, Kaohsiung (TW); Yi-Ting Chen, Kaohsiung (TW); Teng-Chin Kuo, Taipei (TW); Chun-Chi Yu, Taipei (TW)

(73) Assignee: United Microelectronics Corp, Hsinchu (TW)

( * ) Notice: Subject to any disclaimer, the term of this patent is extended or adjusted under 35 U.S.C. 154(b) by 280 days.

(21) Appl. No.: 14/279,039

(22) Filed: May 15, 2014

(65) Prior Publication Data

US 2015/0293461 A1 Oct. 15, 2015

(30) Foreign Application Priority Data

Apr. 11, 2014 (TW) .............................. 103113429 A

(51) Int. Cl.
*G03F 7/20* (2006.01)

(52) U.S. Cl.
CPC ................................ *G03F 7/70516* (2013.01)

(58) Field of Classification Search
CPC ............. G03F 7/70633; G03F 9/7076; G03F 7/70625
See application file for complete search history.

(56) References Cited

U.S. PATENT DOCUMENTS

| | | | |
|---|---|---|---|
| 6,982,793 B1 * | 1/2006 | Yang ..................... | G03F 9/7076 356/401 |
| 7,317,824 B2 | 1/2008 | Ghinovker et al. | |
| 2004/0066517 A1 * | 4/2004 | Huang ................ | G03F 7/70633 356/509 |
| 2005/0012928 A1 * | 1/2005 | Sezginer ................ | G01B 11/26 356/401 |

\* cited by examiner

*Primary Examiner* — Steven H Whitesell Gordon
(74) *Attorney, Agent, or Firm* — J.C. Patents

(57) ABSTRACT

An overlap mark set is provided to have at least a first and a second overlap marks both of which are located at the same pattern layer. The first overlap mark includes at least two sets of X-directional linear patterns, having a preset offset a1 therebetween; and at least two sets of Y-directional linear patterns, having the preset offset a1 therebetween. The second overlap mark includes at least two sets of X-directional linear patterns, having a preset offset b1 therebetween; and at least two sets of Y-directional linear patterns, having the preset offset b1 therebetween. The preset offsets a1 and b1 are not equal.

10 Claims, 5 Drawing Sheets

```
┌─────────────────────────────────────────────────────────────────┐
│ Provide a wafer having a pattern layer thereon, the pattern layer having a │
│ first overlap mark and a second overlap mark, wherein:          │
│ the first overlap mark includes two sets of X-directional linear patterns │
│ having a preset offset a1 therebetween and two sets of Y-directional │──S10
│ linear patterns having the preset offset a1 therebetween;       │
│ the second overlap mark includes at least two sets of X-directional linear │
│ patterns having a preset offset b1 therebetween and at least two sets of │
│ Y-directional linear patterns having the preset offset b1 therebetween, │
│ wherein the preset offset a1 is not equal to the preset offset b1 │
└─────────────────────────────────────────────────────────────────┘
                                 ↓
┌─────────────────────────────────────────────────────────────────┐
│ Use an $i^{th}$ recipe to measure an offset between the two sets of │
│ X-directional linear patterns of the first overlap mark and an offset │
│ between the two sets of Y-directional linear patterns of the first overlap │──S20
│ mark, so as to obtain a measured offset ai1', wherein i = 1 to N, and N │
│ is an integer                                                   │
└─────────────────────────────────────────────────────────────────┘
                                 ↓
┌─────────────────────────────────────────────────────────────────┐
│ Use the $i^{th}$ recipe to measure an offset between the two sets of │
│ X-directional linear patterns of the second overlap mark and an offset │──S30
│ between the two sets of Y-directional linear patterns of the second │
│ overlap mark, so as to obtain a measured offset bi1'            │
└─────────────────────────────────────────────────────────────────┘
                                 ↓
┌─────────────────────────────────────────────────────────────────┐
│ In a coordinate system using a preset offset as a first coordinate axis │
│ and a measured offset as a second coordinate axis, make a plot by │
│ using the preset offset a1 and the measured offset ai1' as a first point │──S40
│ (a1, ai1') and the preset offset b1 and the measured offset bi1' as a │
│ second point (b1, bi1'), so as to obtain a plurality of measurement lines │
└─────────────────────────────────────────────────────────────────┘
                                 ↓
┌─────────────────────────────────────────────────────────────────┐
│ Draw an ideal line by using at least two points where the measured │──S50
│ offset ai1' is equal to the preset offset a1 and the measured offset bi1' │
│ is equal to the preset offset b1                                │
└─────────────────────────────────────────────────────────────────┘
                                 ↓
┌─────────────────────────────────────────────────────────────────┐
│ Select a preferred line closest to the ideal line among the measurement │──S60
│ lines                                                           │
└─────────────────────────────────────────────────────────────────┘
                                 ↓
┌─────────────────────────────────────────────────────────────────┐
│ Use the recipe corresponding to the preferred line to measure a relative │──S70
│ offset between layers of another wafer                          │
└─────────────────────────────────────────────────────────────────┘
```

FIG. 3

OVERLAP MARK SET AND METHOD FOR SELECTING RECIPE OF MEASURING OVERLAP ERROR

CROSS-REFERENCE TO RELATED APPLICATION

This application claims the priority benefit of Taiwan application serial no. 103113429, filed on Apr. 11, 2014. The entirety of the above-mentioned patent application is hereby incorporated by reference herein and made a part of this specification.

BACKGROUND OF THE INVENTION

1. Field of the Invention

The invention relates to an overlap mark set and a method for selecting a recipe of measuring overlap error.

2. Description of Related Art

The photolithography process plays a very important role in manufacturing semiconductor devices. Its accuracy in transferring the pattern has a great influence on the yield rate of the products. Therefore, the process must be monitored constantly, so as to ensure the pattern on the photomask is correctly transferred onto the wafer. The photolithography process is usually monitored by forming an overlap mark on a wafer, so as to check the alignment accuracy between the pre-layer and the post-layer. The most common overlap mark is the box-in-box (BIB) overlap mark. As the line width in the manufacturing process of integrated circuits continuously decreases, the alignment accuracy between the upper and lower wafer layers becomes more and more important. If the recipe (e.g. light source, aperture, filter, etc.) used is inappropriate, the actual overlap error may not be precisely measured.

SUMMARY OF THE INVENTION

The invention provides an overlap mark set capable of being used in the same pattern layer, e.g. a pre-layer or a current layer, so as to choose a preferred recipe of measuring an overlap error.

The invention also provides a method for selecting the recipe of measuring the overlap error capable of obtaining the preferred recipe for overlap measurement in a quickest and most effective way, so as to precisely measure the overlap error or relative offset.

The invention provides an overlap mark set includes at least a first overlap mark and a second overlap mark. The first overlap mark and the second overlap mark are in the same pattern layer. The first overlap mark includes at least two sets of X-directional linear patterns having a preset offset a1 therebetween and at least two sets of Y-directional linear patterns having the preset offset a1 therebetween. The second overlap mark includes at least two sets of X-directional linear patterns having a preset offset b1 therebetween and at least two sets of Y-directional linear patterns having the preset offset b1 therebetween. The preset offset a1 is not equal to the preset offset b1.

According to an embodiment of the invention, the same pattern layer is a pre-layer.

According to an embodiment of the invention, the same pattern layer is a current layer.

According to an embodiment of the invention, one of the preset offset a1 and the preset offset b1 is zero.

According to an embodiment of the invention, the overlap mark set further includes a third overlap mark disposed in the same pattern layer. The third overlap mark includes two sets of X-directional linear patterns having a preset offset c1 therebetween and two sets of Y-directional linear patterns having the preset offset c1 therebetween. In addition, the preset offset c1 is neither equal to the preset offset a1 nor equal to the preset offset b1.

According to an embodiment of the invention, the same pattern layer is a pre-layer.

According to an embodiment of the invention, the same pattern layer is a current layer.

According to an embodiment of the invention, one of the preset offset a1, the preset offset b1, and the preset offset c1 is zero.

The invention provides a method for selecting a recipe of measuring an overlap error including steps as follows. A wafer is provided. A pattern layer is disposed on the wafer. The pattern layer includes at least a first overlap mark and a second overlap mark. The first overlap mark includes at least two sets of X-directional linear patterns having a preset offset a1 therebetween and at least two sets of Y-directional linear patterns having the preset offset a1 therebetween. The second overlap mark includes at least two sets of X-directional linear patterns having a preset offset b1 therebetween and at least two sets of Y-directional linear patterns having the preset offset b1 therebetween. The preset offset a1 is not equal to the preset offset b1. An $i^{th}$ recipe is used to measure an offset between the two sets of X-directional linear patterns of the first overlap mark and an offset between the two sets of Y-directional linear patterns of the first overlap mark, so as to obtain a measured offset ai1'. In addition, i=1 to N, and N is an integer. The $i^{th}$ recipe is used to measure an offset between the two sets of X-directional linear patterns of the second overlap mark and an offset between the two sets of Y-directional linear patterns of the second overlap mark, so as to obtain a measured offset bi1'. In a coordinate system using a preset offset as a first coordinate axis and a measured offset as a second coordinate axis, a plot is made by using the preset offset a1 and the measured offsets ai1' as a first point (a1, ai1') and the preset offset b1 and the measured offsets bi1' as a second point (b1, bi1'), so as to obtain a plurality of measurement lines. An ideal line is drawn by using two points where the measured offsets ai1' are equal to the preset offset a1 and the measured offsets bi1' are equal to the preset offset b1. A preferred line closest to the ideal line is chosen among the measurement lines. A recipe corresponding to the preferred line is used to measure a relative offset between layers of another wafer.

According to an embodiment of the invention, the $i^{th}$ recipe includes a light source, an aperture, a filter, or a combination thereof.

According to an embodiment of the invention, the $i^{th}$ recipe includes a light source, and the light source includes a white light, a singe-wavelength light, or a dual-wavelength light.

According to an embodiment of the invention, the pattern layer is a pre-layer.

According to an embodiment of the invention, the pattern layer is a current layer.

According to an embodiment of the invention, one of the preset offset a1 and the preset offset b1 is zero.

According to an embodiment of the invention, the pattern layer further includes a third overlap mark, wherein the third overlap mark includes two sets of X-directional linear patterns having a preset offset c1 therebetween and two sets of Y-directional linear patterns having the preset offset c1 therebetween. The method for selecting the recipe of measuring the overlap error further includes steps as follows.

The $i^{th}$ recipe is used to measure an offset between the two sets of X-directional linear pattern of the third overlap mark and an offset between the two sets of Y-directional linear patterns of the third overlap mark to obtain a measured offset ci1'. Making the plot by using the preset offset a1 and the measured offset ai1' as the first point (a1, ai1') and the preset offset b1 and the measured offset bi1' as the second point (b1, bi1') further includes making the plot by using the preset offset c1 and the measured offset ci1' as a third point (c1, ci1').

According to an embodiment of the invention, the pattern layer is a pre-layer.

According to an embodiment of the invention, the pattern layer is a current layer.

According to an embodiment of the invention, one of the preset offset a1, the preset offset b1, and the preset offset c1 is zero.

The overlap mark set of the invention includes at least two sets of linear patterns having different offsets. The overlap mark set may be used in the same pattern layer, such as the pre-layer or the current layer. The overlap mark set may be used to select the preferred recipe for measuring the overlap error.

The method for selecting the recipe of measuring the overlap error of the invention is capable of obtaining the preferred recipe for overlap measurement in the quickest and most effective way, so as to precisely measure the overlap error or relative offset.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a flow chart of a method for selecting a recipe of measuring an overlap error.

DESCRIPTION OF THE EMBODIMENTS

Figure 1A:
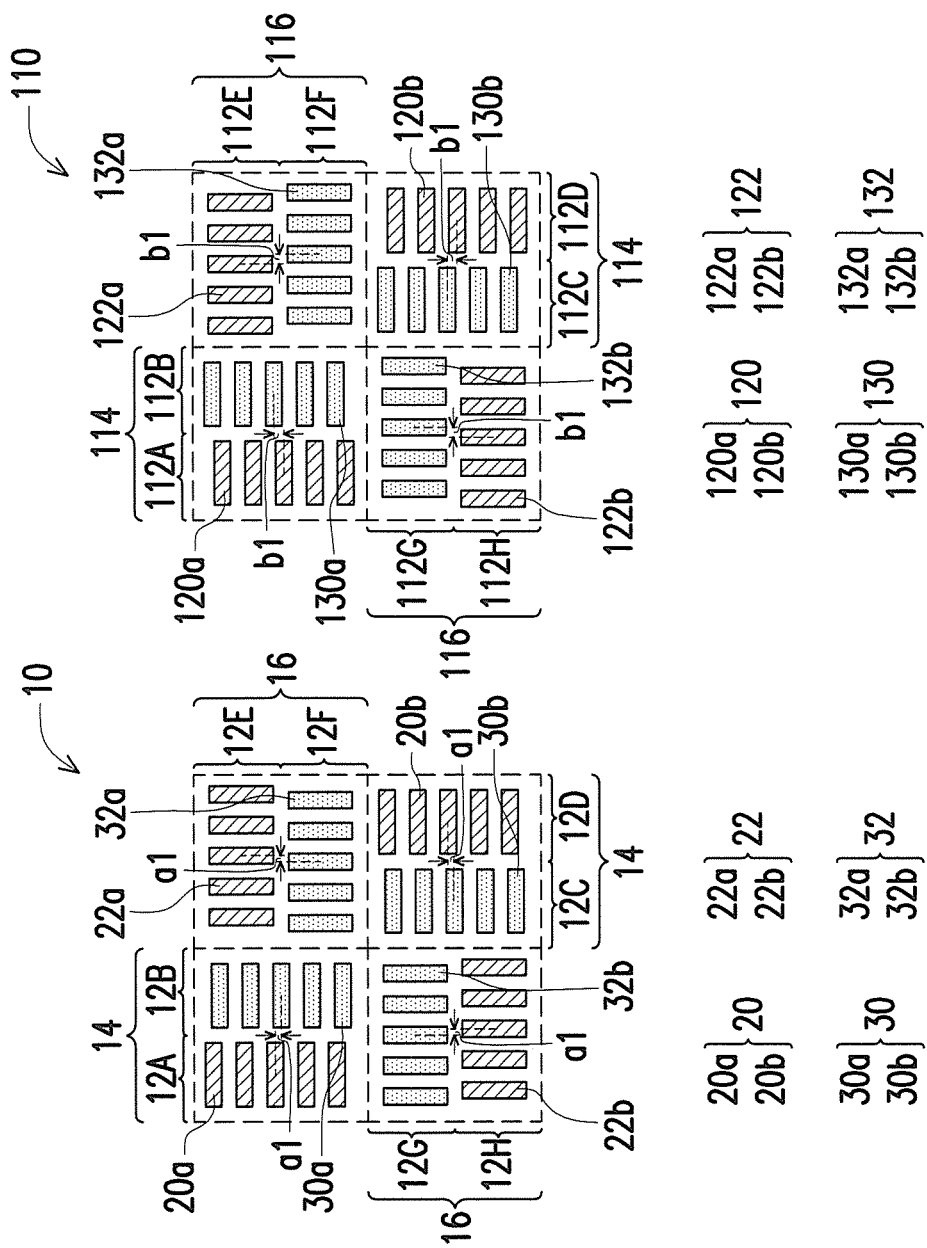
FIG. 1A is a diagram of an overlap mark set according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
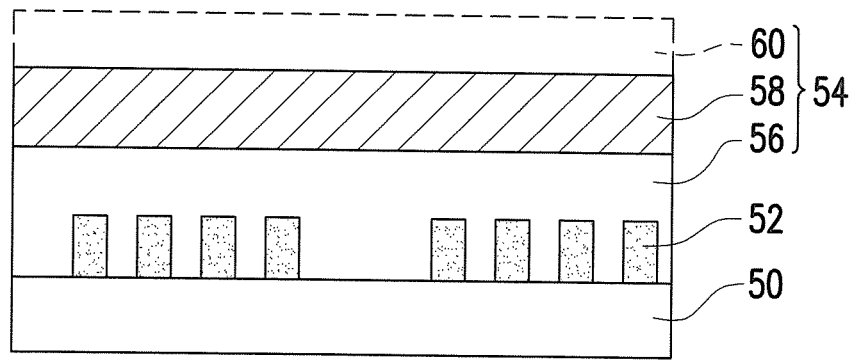
FIG. 2A is a diagram of a semiconductor device that can be made by adapting an overlap mark set of the invention.
Figure 2B:
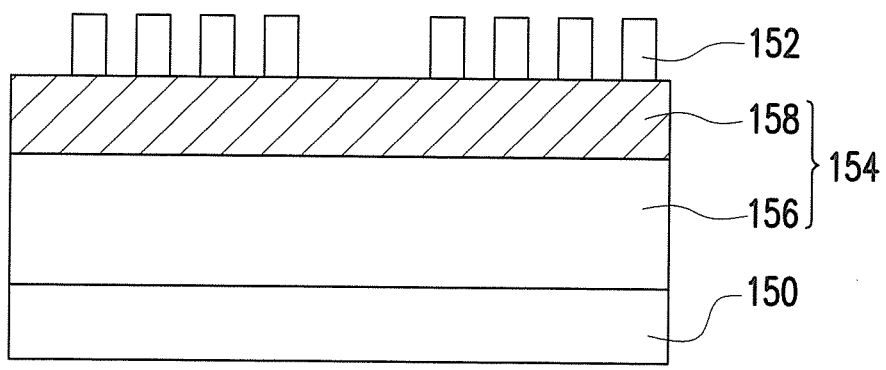
FIG. 2B is a diagram of another semiconductor device that can be made by adapting an overlap mark set of the invention.

FIG. 1A is a diagram of an overlap mark set according to a first embodiment of the invention. FIG. 2A is a diagram of a semiconductor device that can be made by adapting an overlap mark set of the invention. FIG. 2B is a diagram of a semiconductor device that can be made by adapting an overlap mark set of the invention.

Referring to FIG. 1A, the overlap mark set of this embodiment of the invention includes an overlap mark 10 and an overlap mark 110. More specifically, the overlap mark 10 and the overlap mark 110 are in the same pattern layer. In an embodiment, referring to FIGS. 1A and 2A, the overlap mark 10 and the overlap mark 110 are a portion of a first pattern layer 52. The first pattern layer 52 is a pre-layer, for example, and is covered by a material layer 54 on a wafer 50. In an exemplary embodiment, the first pattern layer 52 is a metal layer, a polysilicon layer, or a silicon nitride layer, for example. The material layer 54 is, for example, a stack layer composed of a dielectric layer 56 and a hard mask layer 58, or a stack layer composed of the dielectric layer 56, the hard mask layer 58, and an unpatterned photoresist layer 60.

In another embodiment, referring to FIGS. 1A and 2B, the overlap mark 10 and the overlap mark 110 are a portion of a second pattern layer 152. The second pattern layer 152 is a current layer, for example, and is disposed on a material layer 154 of a wafer 150. In an exemplary embodiment, the second pattern layer 152 is a photoresist layer, for example, and the material layer 154 is a dielectric layer 156 and a hard mask layer 158, for example.

Referring to FIG. 1A, the overlap mark 10 includes a plurality of regions. In the exemplary embodiment, the overlap mark 10 includes eight regions 12A to 12H. The eight regions 12A to 12H are separated from each other and not overlapped. The eight regions 12A to 12H may be divided into two groups 14 and 16. The group 14 includes the regions 12A to 12D configured to provide an offset information in Y direction. The group 16 includes the region 12E to 12H configured to provide an offset information in X direction.

The overlap mark 10 includes at least two sets of X-directional linear patterns 20 and 30 and at least two sets of Y-directional linear patterns 22 and 32. In the overlap mark 10, the first set of X-directional linear patterns 20 in the two sets of X-directional linear patterns photoresist 20 and 30 may include two parts that are respectively disposed in the region 12A and the region 12D. A first set of X-directional linear patterns 20a disposed in the region 12A and a first set of X-directional linear patterns 20b disposed in the region 12D are respectively formed of a plurality of line segments that are parallel to each other and arranged in Y direction. The second set of X-directional linear patterns 30 of the two sets of X-directional linear patterns photoresist 20 and 30 may include two parts that are respectively disposed in the regions 12B and 12C. A second set of X-directional linear patterns 30a in the region 12B and a second set of X-directional linear patterns 30b in the region 12C are respectively formed of a plurality of line segments that are parallel to each other and arranged in Y direction.

In the overlap mark 10, the first set of Y-directional linear patterns 22 in the two sets of Y-directional linear patterns 22 and 32 include two parts that are respectively disposed in the region 12E and the region 12H. A first set of Y-directional linear patterns 22a disposed in the region 12E and a first set of Y-directional linear patterns 22b disposed in the region 12H are respectively formed of a plurality of line segments that are parallel to each other and arranged in X direction. The second set of Y-directional linear patterns 32 in the two sets of Y-directional linear patterns 22 and 32 include two parts that are respectively disposed in the region 12F and the region 12G. A second set of Y-directional linear patterns 32a disposed in the region 12F and a second set of Y-directional linear patterns 32b disposed in the region 12G are respectively formed of a plurality of line segments that are parallel to each other and arranged in X direction.

In the embodiments of the invention, widths of the line segments and pitches of the line segments in the regions 12A to 12H may be the same. However, the linear patterns in two adjacent regions have a preset offset a1 therebetween. More specifically, the first set of X-directional linear patterns 20a disposed in the region 12A and the second set of X-directional linear patterns 30a disposed in the region 12B have the preset offset a1 therebetween. The first set of X-directional linear patterns 20b disposed in the region 12D and the second set of X-directional linear patterns 30b in the region 12C also have the preset offset a1 therebetween. The first set of Y-directional linear patterns 22a disposed in the region 12E and the second set of Y-directional linear patterns 32a disposed in the region 12F also have the preset offset a1 therebetween. Similarly, the first set of Y-directional linear patterns 22b disposed in the region 12H and the second set of Y-directional linear patterns 32b disposed in the region 12H have the preset offset a1 therebetween.

In an embodiment, the preset offset a1 may be a distance between central lines of the linear patterns in two adjacent regions. For example, the preset offset a1 between the first set of X-directional linear patterns 20a in the region 12A and the second set of X-directional linear patterns 30a in the region 12B may refer to a distance between a central line between a lowermost line segment and a topmost line segment in the first set of X-directional linear patterns 20a in the region 12A and a central line between a lowermost line segment and a topmost line segment in the second set of X-directional linear pattern 30a in the region 12B.

In another embodiment, the preset offset a1 may be a distance between central lines of middlemost line segments of the linear patterns in two adjacent regions. For example, the preset offset a1 between the first set of X-directional linear patterns 20a in the region 12A and the second set of X-directional linear patterns 30a in the region 12B may refer to a distance between a central line of a middlemost line segment in the first set of X-directional linear patterns 20a in the region 12A and a central line of a middlemost line segment in the second set of X-directional linear patterns 30a in the region 12B. However, setting of the preset offset a1 is not limited to the above and may be configured based on practical needs.

Referring to FIG. 1A, the overlap mark 110 includes a plurality of regions. In the exemplary embodiment, the overlap mark 110 includes eight regions 112A to 112H. The eight regions 112A to 112H are separated from each other and not overlapped. The eight regions 112A to 112H may be divided into two groups 114 and 116. The group 114 includes the regions 112A to 112D configured to provide an offset information in Y direction. The group 116 includes the region 112E to 112H configured to provide an offset information in X direction.

The overlap mark 110 includes at least two sets of X-directional linear patterns 120 and 130 and at least two sets of Y-directional linear patterns 122 and 132. In the overlap mark 110, the first set of X-directional linear patterns 120 in the two sets of X-directional linear patterns 120 and 130 may include two parts that are respectively disposed in the region 112A and the region 112D. A first set of X-directional linear patterns 120a disposed in the region 112A and a first set of X-directional linear patterns 120b disposed in the region 112D are respectively formed of a plurality of line segments that are parallel to each other and arranged in Y direction. The second set of X-directional linear patterns 130 of the two sets of X-directional linear patterns 120 and 130 may include two parts that are respectively disposed in the regions 112B and 112C. A second set of X-directional linear patterns 130a disposed in the region 112B and a second set of X-directional linear patterns 130b disposed in the region 112C are respectively formed of a plurality of line segments that are parallel to each other and arranged in Y direction.

In the overlap mark 110, the first set of Y-directional linear patterns 122 in the two sets of Y-directional linear patterns 122 and 132 include two parts that are respectively disposed in the region 112E and the region 112H. A first set of Y-directional linear patterns 122a disposed in the region 112E and a first set of Y-directional linear patterns 122b disposed in the region 112H are respectively formed of a plurality of line segments that are parallel to each other and arranged in X direction. The second set of Y-directional linear patterns 132 in the two sets of Y-directional linear patterns 122 and 132 include two parts that are respectively disposed in the region 112F and the region 112G. A second set of Y-directional linear patterns 132a disposed in the region 112F and a second set of Y-directional linear patterns 132b disposed in the region 112G are respectively formed of a plurality of line segments that are parallel to each other and arranged in X direction.

In the embodiments of the invention, widths of the line segments and pitches of the line segments in the regions 112A to 112H may be the same. However, the linear patterns in two adjacent regions have a preset offset b1 therebetween. More specifically, the first set of X-directional linear patterns 120a disposed in the region 112A and the second set of X-directional linear patterns 130a disposed in the region 112B have the preset offset b1 therebetween. The first set of X-directional linear patterns 120b disposed in the region 112D and the second set of X-directional linear patterns 130b in the region 112C also have the preset offset b1 therebetween. The first set of Y-directional linear patterns 122a disposed in the region 112E and the second set of Y-directional linear patterns 132a disposed in the region 112F also have the preset offset b1 therebetween. Similarly, the first set of Y-directional linear patterns 122b disposed in the region 112H and the second set of Y-directional linear patterns 132b disposed in the region 112G have the preset offset b1 therebetween. The preset offset b1 is defined in a way similar to the preset offset a1. Therefore, no further details in this respect will be reiterated hereinafter. The preset offset b1 is not equal to the preset offset a1. In an embodiment, one of the preset offset a1 and the preset offset b1 is zero.

In the overlap mark set of the invention, the widths of the line segments in the overlap mark 10 may be the same or different from the widths of the line segments in the overlap mark 110, and the pitches of the line segments in the overlap mark 10 may be the same or different from the pitches of the line segments of the overlap mark 110.

In FIG. 1A, the overlap mark 10 includes the two sets of X-directional linear patterns 20 and 30 and the two sets of Y-directional linear patterns 22 and 32, and the overlap mark 110 includes the two sets of X-directional linear patterns 120 and 130 and the two sets of Y-directional linear patterns 122 and 132. However, the overlap mark set of the invention is not limited thereto.

In other embodiments, the overlap mark 10 may include three or more sets of X-directional linear patterns and there or more sets of Y-directional linear patterns. In the overlap mark 10, the three or more sets of X-directional linear patterns have the preset offset a1 therebetween, and the three or more sets of Y-directional linear patterns have the preset offset a1 therebetween. Similarly, the overlap mark 110 may include three or more sets of X-directional linear patterns and three or more sets of Y-directional linear patterns. In the overlap mark 110, the three or more sets of X-directional linear patterns have the preset offset b1 therebetween, and the three or more sets of Y-directional linear patterns have the preset offset b1 therebetween.

In addition, in the embodiment above, the overlap mark set includes two overlap marks, namely the overlap marks 10 and 110. However, the invention is not limited thereto. In other embodiments, the overlap mark set may include three or more overlap marks.

Figure 1B:
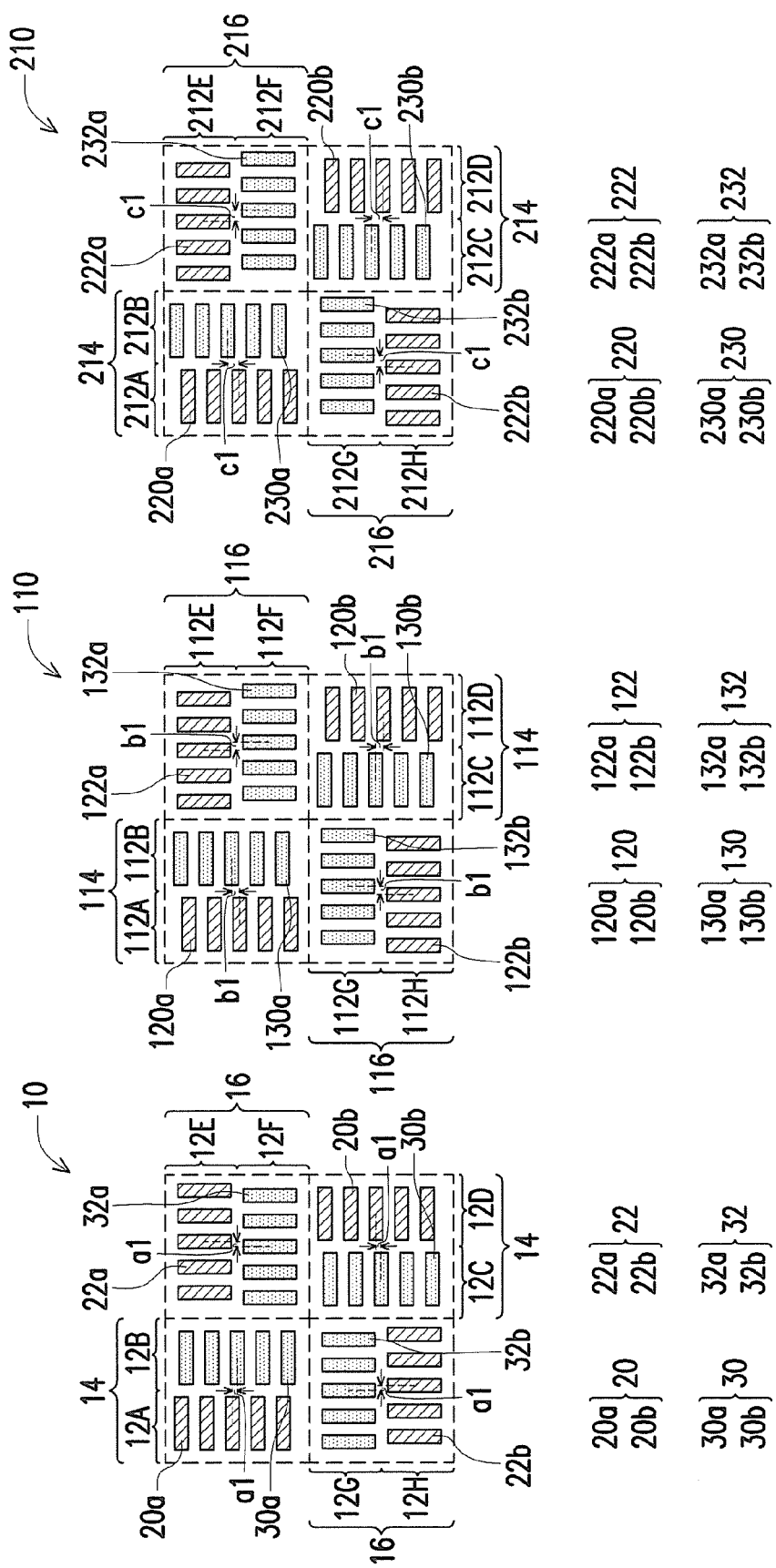
FIG. 1B is a diagram of an overlap mark set according to a second embodiment of the invention.

FIG. 1B is a diagram of an overlap mark set according to a second embodiment of the invention. Referring to FIG. 1B, the overlap mark set includes the overlap mark 10, the overlap mark 110, and an overlap mark 210. More specifically speaking, the overlap marks 10, 110, and 210 are in the same pattern layer. The overlap marks 10 and 110 are the same as the embodiments above. Therefore, no further details in this respect will be reiterated below. Details regarding the overlap mark 210 are provided in the following.

Referring to FIG. 1B, the overlap mark 210 includes a plurality of regions. In the exemplary embodiment, the overlap mark 210 includes eight regions 212A to 212H. The eight regions 212A to 212H are separated from each other and not overlapped. The eight regions 212A to 212H may be divided into two groups 214 and 216. The group 214 includes the regions 212A to 212D configured to provide an offset information in Y direction. The group 216 includes the region 212E to 212H configured to provide an offset information in X direction.

The overlap mark 210 includes two sets of X-directional linear patterns 220 and 230 and two sets of Y-directional linear patterns 222 and 232. In the overlap mark 210, the first set of X-directional linear patterns 220 in the two sets of X-directional linear patterns 220 and 230 may include two parts that are respectively disposed in the region 212A and the region 212D. A first set of X-directional linear patterns 220a disposed in the region 212A and a first set of X-directional linear patterns 220b disposed in the region 212D are respectively foamed of a plurality of line segments that are parallel to each other and arranged in Y direction. The second set of X-directional linear patterns 230 of the two sets of X-directional linear patterns 220 and 230 may include two parts that are respectively disposed in the regions 212B and 212C. A second set of X-directional linear patterns 230a disposed in the region 212B and a second set of X-directional linear patterns 230b disposed in the region 212C are respectively formed of a plurality of line segments that are parallel to each other and arranged in Y direction.

In the overlap mark 210, the first set of Y-directional linear patterns 222 in the two sets of Y-directional linear patterns 222 and 232 include two parts that are respectively disposed in the region 212E and the region 212H. A first set of Y-directional linear patterns 222a disposed in the region 212E and a first set of Y-directional linear patterns 222b disposed in the region 212H are respectively formed of a plurality of line segments that are parallel to each other and arranged in X direction. The second set of Y-directional linear patterns 232 in the two sets of Y-directional linear patterns 222 and 232 include two parts that are respectively disposed in the region 212F and the region 212G. A second set of Y-directional linear patterns 232a disposed in the region 212F and a second set of Y-directional linear patterns 232b disposed in the region 212G are respectively formed of a plurality of line segments that are parallel to each other and arranged in X direction.

In the embodiments of the invention, widths of the line segments and pitches of the line segments in the regions 212A to 212H may be the same. However, the linear patterns in two adjacent regions have a preset offset c1 therebetween. More specifically speaking, the second set of X-directional linear patterns 230a disposed in the region 212B and the second set of X-directional linear patterns 230b disposed in the region 212C are respectively formed of a plurality of line segments that are parallel to each other and arranged in Y direction. The first set of X-directional linear patterns 220a disposed in the region 212A and the second set of X-directional linear patterns 230a disposed in the region 212B have the preset offset c1 therebetween. The first set of X-directional linear patterns 220b disposed in the region 212D and the second set of X-directional linear patterns 230b in the region 212C also have the preset offset c1 therebetween. The second set of Y-directional linear patterns 232a disposed in the region 212F and the second set of Y-directional linear patterns 232b disposed in the region 212G are respectively formed of a plurality of line segments that are parallel to each other and arranged in X direction. The first set of Y-directional linear patterns 222a disposed in the region 212E and the second set of Y-directional linear patterns 232a disposed in the region 212F also have the preset offset c1 therebetween. Similarly, the first set of Y-directional linear patterns 222b disposed in the region 212H and the second set of Y-directional linear patterns 232b disposed in the region 212G have the preset offset c1 therebetween. The preset offset c1 is defined in a way similar to the preset offset a1. Therefore, no further details in this respect will be reiterated hereinafter. The preset offset c1 is neither equal to the preset offset a1 nor equal to the preset offset b1. In an embodiment, one of the preset offsets a1, b1, and c1 is zero.

In the overlap mark set of the invention, the widths of the line segments in the overlap mark 10, the overlap mark 110, and the overlap mark 210 may be the same or different, and the pitches of the line segments in the overlap mark 10, the overlap mark 110, and the overlap mark 210 may be the same or different.

In addition, in FIGS. 1A and 1B, the line segments in the overlap mark 10, the overlap mark 110, and the overlap mark 210 are described as solid strip components. However, the invention is not limited thereto. Each of the line segments of the overlap mark 10, the overlap mark 110, and the overlap mark 210 may be composed of a plurality of thinner line segments or a plurality of dots.

Figure 4:
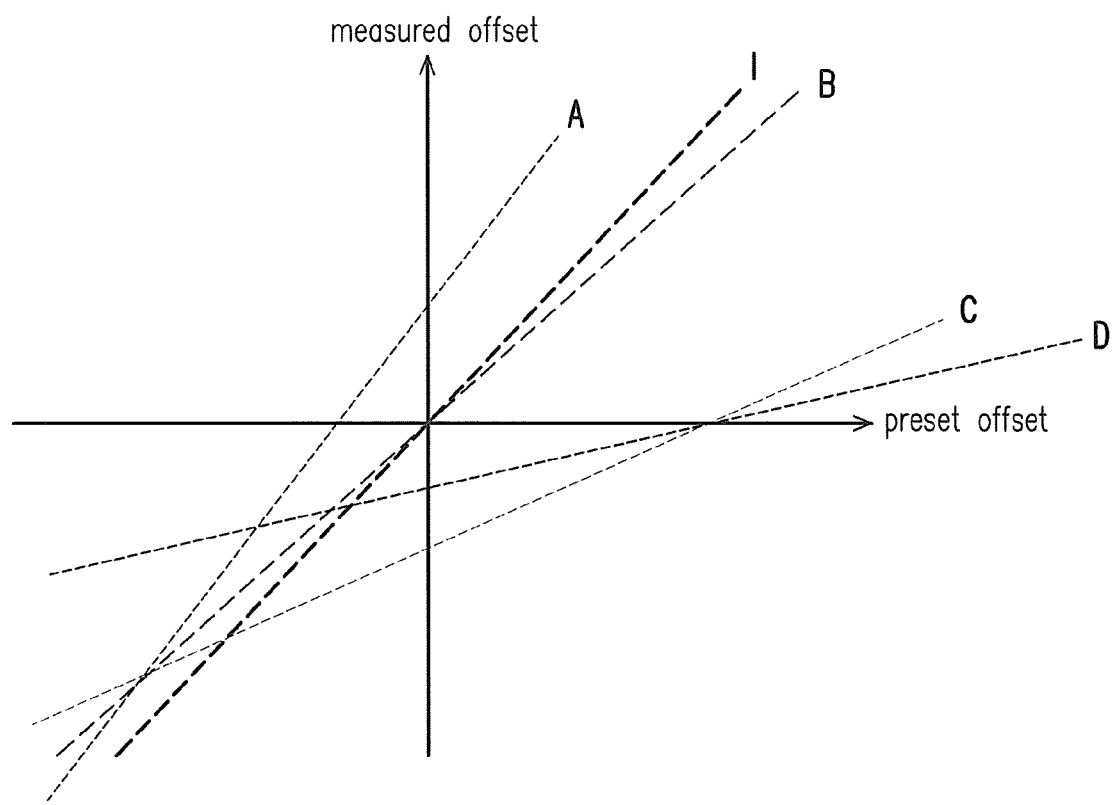
FIG. 4 is a diagram illustrating a relation between an ideal line and measurement lines obtained by using different recipes to measure an overlap mark set.

FIG. 3 is a flow chart of a method for selecting a recipe of measuring an overlap error. FIG. 4 is a diagram illustrating a relation between an ideal line and measurement lines obtained by using different recipes to measure an overlap mark set.

Referring to FIG. 3, a wafer is provided at Step S10. The wafer is the wafer 50 shown in FIG. 2A or the wafer 150 shown in FIG. 2B, for example. A pattern layer is disposed on the wafer. The pattern layer may be the first pattern layer 52 shown in FIG. 2A, or the second pattern layer 152 shown in FIG. 2B.

The pattern layer has an overlap mark set. The overlap mark set includes at least a first overlap mark and a second overlap mark. The first overlap mark is the overlap mark 10 in FIG. 1A or 1B, for example. The overlap mark 10 includes two sets of X-directional linear patterns (the first set of X-directional linear patterns 20 and the second set of X-directional linear patterns 30) having the preset offset a1 therebetweeen and two sets of Y-directional linear patterns (the first set of Y-directional linear patterns 22 and the second set of Y-directional linear patterns 32) having the preset offset a1 therebetween as well.

The second overlap mark is the overlap mark 110 in FIG. 1A or 1B, for example. The overlap mark 110 includes two sets of X-directional linear patterns (the first set of X-directional linear patterns 120 and the second set of X-directional linear patterns 130) having the preset offset b1 therebetweeen and two sets of Y-directional linear patterns (the first set of Y-directional linear patterns 122 and the second set of Y-directional linear patterns 132) having the preset offset b1 therebetween as well. The preset offset b1 is not equal to the preset offset a1.

At Step S20, an $i^{th}$ recipe is used to measure an offset between the two sets of X-directional linear patterns (e.g. the first set of X-directional linear patterns 20 and the second set of X-directional linear patterns 30 of the overlap mark 10 in FIG. 1A or 1B) of the first overlap mark and an offset between the two sets of Y-directional linear patterns (e.g. the first set of Y-directional linear patterns 22 and the second set of Y-directional linear patterns 32 of the overlap mark 10 in FIG. 1A or 1B) of the first overlap mark to obtain a measured offset ai1'. In addition, i=1 to N, and N is an integer.

At Step S30, the $i^{th}$ recipe is used to measure an offset between the two sets of X-directional linear patterns (e.g. the first set of X-directional linear patterns 120 and the second set of X-directional linear patterns 130 of the overlap mark 110 in FIG. 1A or 1B) of the second overlap mark and an offset between the two sets of Y-directional linear patterns (e.g. the first set of Y-directional linear patterns 122 and the second set of Y-directional linear patterns 132 of the overlap mark 110 in FIG. 1A or 1B) of the second overlap mark to obtain a measured offset bi1'. The $i^{th}$ recipe includes a light source, an aperture, a filter or a combination thereof. The light source includes a white light, a single-wavelength light, or a dual-wavelength light. The single-wavelength light is a blue light, a red light, or a green light, for example.

More specifically, i represents an integer from 1 to 4 in an exemplary embodiment. A first recipe is a white light. The white light is used to measure the offset between the two sets of X-directional linear patterns (e.g. the first set of X-directional linear patterns 20 and the second set of X-directional linear patterns 30 of the overlap mark 10 in FIG. 1A or 1B) of the first overlap mark and the offset between the two sets of Y-directional linear patterns (e.g. the first set of Y-directional linear patterns 22 and the second set of Y-directional linear patterns 32 of the overlap mark 10 in FIG. 1A or 1B) of the first overlap mark to obtain a measured offset a11'.

Then, the white light is used to measure the offset between the two sets of X-directional linear patterns (e.g. the first set of X-directional linear patterns 120 and the second set of X-directional linear patterns 130 of the overlap mark 110 in FIG. 1A or 1B) of the second overlap mark and the offset between the two sets of Y-directional linear patterns (e.g. the first set of Y-directional linear patterns 122 and the second set of Y-directional linear patterns 132 of the overlap mark 110 in FIG. 1A or 1B) of the second overlap mark to obtain a measured offset b11'.

A second recipe is a blue light. The blue light is used to measure the offset between the two sets of X-directional linear patterns of the first overlap mark and the offset between the two sets of Y-directional linear patterns of the first overlap mark to obtain a measured offset a21'. Then, the blue light is used to measure the offset between the two sets of X-directional linear patterns of the second overlap mark and the offset between the two sets of Y-directional linear pattern of the second overlap mark to obtain a measured offset b21'.

A third recipe is a red light. The red light is used to measure the offset between the two sets of X-directional linear patterns of the first overlap mark and the offset between the two sets of Y-directional linear pattern of the first overlap mark to obtain a measured offset a31'. Then, the red light is used to measure the offset between the two sets of X-directional linear patterns of the second overlap mark and the offset between the two sets of Y-directional linear patterns of the second overlap mark to obtain a measured offset b31'.

A fourth recipe is a green light. The green light is used to measure the offset between the two sets of X-directional linear patterns of the first overlap mark and the offset between the two sets of Y-directional linear patterns of the first overlap mark to obtain a measured offset a41'. Then, the green light is used to measure the offset between the two sets of X-directional linear patterns of the second overlap mark and the offset between the two sets of Y-directional linear patterns of the second overlap mark to obtain a measured offset b41'.

Referring to FIGS. 3 and 4, at Step S40, a coordinate system is established by using the preset offset as a first coordinate axis (e.g. X axis), and using the measured offset as a second coordinate axis (e.g. Y-axis). Then, a plot is made in the coordinate system by using at least the preset offset a1 and the measured offset ai1' as a first point (a1, ai1') and the preset offset b1 and the measured offset bi1' as a second point (b1, bi1') to obtain a plurality of measurement lines. In the exemplary embodiment, measurement lines A, B, C, and D are obtained. The measurement line A is drawn by connecting a point (a1, a11') and a point (b1, b11'). The measurement line B is drawn by connecting a point (a1, a21') and a point (b1, b21'). The measurement line C is drawn by connecting a point (a1, a31') and a point (b1, b31'). The measurement line D is drawn by connecting a point (a1, a41') and a point (b1, b41').

Referring to FIGS. 3 and 4, at Step S50, an ideal line is drawn by using at least two points at which the measured offset ai1' is equal to the preset offset a1 and the measured offset bi1' is equal to the preset offset b1.

Referring to FIGS. 3 and 4, at Step S60, a preferred line is selected among the measurement lines A, B, C, and D by selecting a line closest to the ideal line I. In FIG. 2, among the measurement lines A, B, C, and D, the measurement line B is closest to the ideal line I. Therefore, the measurement line B is the preferred line. It is thus indicated that measurement with the recipe corresponding to the preferred line is the most precise.

Referring to FIGS. 3 and 4, at Step S70, the recipe (the preferred recipe) corresponding to the preferred line is used to measure a relative offset between layers of another wafer. In FIG. 4, the measurement line B is the preferred line, and the recipe corresponding to the measurement line B is the blue light. Therefore, the blue light may be used to measure the relative offset between layers of another wafer. A material layer of the another wafer may have the same, similar, or different structure in comparison with the material layer of the wafer. In other words, even if the structure of the material layer of the another wafer is similar to or different from the structure of the material layer of the wafer, the recipe corresponding to the preferred line may still be used to measure the relative offset between layers in the another wafer. If the measured relative offset is not precise enough, Steps S10 to S70 may be repeated again to use another recipe obtained to measure the relative offset between layers. For example, the preferred recipe may be obtained by going through the steps above after the photoresist layer 60 shown in FIG. 2A is formed and before the photoresist layer 60 is patterned. When the photoresist layer 60 of the semiconductor device having the structure shown in FIG. 2A is patterned, the preferred recipe may be used to measure an overlap error between the current layer and the pre-layer. Also, when the current layer undergoes two exposure processes, the preferred recipe may be used to measure a relative offset between two parts formed through the two exposures in the current layer.

In another embodiment, the overlap mark set in the pattern layer of the wafer further includes a third overlap mark in addition to the first overlap mark and the second overlap mark. The third overlap mark is the overlap mark 210 shown in FIG. 1B, for example. The overlap mark 210 includes two sets of X-directional linear patterns (the first set of X-directional linear patterns 220 and the second set of X-directional linear patterns 230) having the preset offset c1 therebetweeen and two sets of Y-directional linear patterns (the first set of Y-directional linear patterns 222 and the second set of Y-directional linear patterns 232) having the preset offset c1 therebetween as well. Selecting the recipe of measuring the overlap error further includes, after Step S30, using the $i^{th}$ recipe to measure an offset between the two sets of X-directional linear patterns of the third overlap mark and an offset between the two sets of Y-directional linear patterns of the third overlap mark to obtain a measured offset ci1'. In addition, Step 40, namely making the plot by using the preset offset a1 and the measured offset ai1' as the first point (a1, ai1') and the preset offset b1 and the measured offset bi1' as the second point (b1, bi1'), further includes making the plot by using the preset offset c1 and the measured offset ci1' as a third point (c1, ci1').

In this embodiment, the white, blue, red, and green light is used as exemplary examples of the recipe. However, the recipe of the invention is not limited thereto. In other embodiment, the recipe may be an aperture, a filter, etc. In addition, the invention may firstly select light with a preferred wavelength, such as the blue light in the embodiment. Then, the light with the preferred wavelength (e.g. blue light) is provided with apertures of difference sizes to further select a preferred aperture size. Then, the light with the preferred wavelength and the aperture in the preferred size are provided with different filters to select a preferred filter. Then, the light with the preferred wavelength, the aperture in the preferred size, and the preferred filter may serve as the preferred recipe to measure the relative offset between layers of another wafer.

In view of the foregoing, the overlap mark set of the invention includes at least two sets of linear patterns having different offsets. The overlap mark set may be used in the same pattern layer, such as the pre-layer or the current layer. The overlap mark set may be used to select the preferred recipe for overlap measurement. In addition, through the method for selecting the recipe of measuring the overlap error of the invention, the overlap mark set is capable of obtaining the preferred recipe for overlap measurement in the quickest and most effective way, so as to precisely measure the overlap error or relative offset.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for selecting a recipe of measuring an overlap error, comprising:
    providing a wafer having a pattern layer disposed thereon, the pattern layer having at least one first overlap mark and a second overlap mark, wherein:
    the first overlap mark comprises at least two sets of X-directional linear patterns having a preset offset a1 therebetween and at least two sets of Y-directional linear patterns having the preset offset a1 therebetween; and
    the second overlap mark comprises at least two sets of X-directional linear patterns having a preset offset b1 therebetween and at least two sets of Y-directional linear patterns having the preset offset b1 therebetween, wherein the preset offset a1 is not equal to the preset offset b1;
    using an $i^{th}$ recipe to measure an offset between the two sets of X-directional linear patterns of the first overlap mark and an offset between the two sets of Y-directional linear patterns of the first overlap mark, so as to obtain a measured offset ai1', wherein i=1 to N, and N is an integer;
    using the $i^{th}$ recipe to measure an offset between the two sets of X-directional linear patterns of the second overlap mark and an offset between the two sets of Y-directional linear patterns of the second overlap mark, so as to obtain a measured offset bi1';
    in a coordinate system using a preset offset as a first coordinate axis and a measured offset as a second coordinate axis, making a plot by using the preset offset a1 and the measured offsets ai1' as a first point (a1, ai1') and the preset offset b1 and the measured offsets bi1' as a second point (b1, bi1'), so as to obtain a plurality of measurement lines;
    drawing an ideal line by using two points where the measured offsets ai1' are equal to the preset offset a1 and the measured offsets bi1' are equal to the preset offset b1;
    selecting a preferred line closest to the ideal line among the measurement lines; and
    using the recipe corresponding to the preferred line to measure a relative offset between layers of another wafer.

2. The method for selecting the recipe of measuring the overlap error as claimed in claim 1, wherein the $i^{th}$ recipe comprises a light source, an aperture, a filter, or a combination thereof.

3. The method for selecting the recipe of measuring the overlap error as claimed in claim 1, wherein the $i^{th}$ recipe comprises a light source, and the light source comprises a white light, a single-wavelength light, or a dual-wavelength light.

4. The method for selecting the recipe of measuring the overlap error as claimed in claim 1, wherein the pattern layer is a pre-layer.

5. The method for selecting the recipe of measuring the overlap error as claimed in claim 1, wherein the pattern layer is a current layer.

6. The method for selecting the recipe of measuring the overlap error as claimed in claim 1, wherein one of the preset offset a1 and the preset offset b1 is zero.

7. The method for selecting the recipe of measuring the overlap error as claimed in claim 1, wherein the pattern layer further comprises a third overlap mark, wherein:

the third overlap mark comprises two sets of X-directional linear patterns having a preset offset c1 therebetween and at least two sets of Y-directional linear patterns having the preset offset c1 therebetween, and the method for selecting the recipe of measuring the overlap error further comprises:

using the $i^{th}$ recipe to measure an offset between the two sets of X-directional linear pattern of the third overlap mark and an offset between the two sets of Y-directional linear patterns of the third overlap mark to obtain a measured offset ci1'; and when making the plot by using the preset offset a1 and the measured offsets ai1' as the first point (a1, ai1') and the preset offset b1 and the measured offsets bi1' as the second point (b1, bi1'), further comprising making the plot by using the preset offset c1 and the measured offsets ci1' as a third point (c1, ci1').

8. The method for selecting the recipe of measuring the overlap error as claimed in claim 7, wherein the pattern layer is a pre-layer.

9. The method for selecting the recipe of measuring the overlap error as claimed in claim 7, wherein the pattern layer is a current layer.

10. The method for selecting the recipe of measuring the overlap error as claimed in claim 7, wherein one of the preset offset a1, the preset offset b1, and the preset offset c1 is zero.

* * * * *